(12) United States Patent
Brophy

(10) Patent No.: US 7,405,474 B1
(45) Date of Patent: Jul. 29, 2008

(54) LOW COST THERMALLY ENHANCED SEMICONDUCTOR PACKAGE

(75) Inventor: Brenor L. Brophy, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 159 days.

(21) Appl. No.: 11/246,361

(22) Filed: Oct. 7, 2005

Related U.S. Application Data

(66) Substitute for application No. 60/618,482, filed on Oct. 12, 2004.

(51) Int. Cl.
*H01L 23/12* (2006.01)

(52) U.S. Cl. .................. 257/700; 257/702; 257/703; 257/698; 257/773; 257/774; 257/776; 257/787; 257/E23.001; 257/E23.011; 257/62; 257/E23.069; 257/E23.173

(58) Field of Classification Search .......... 257/276, 257/625, 675, 706, 707, 712–722, E33.075, 257/E31.131, E23.051, E23.08–E23.113, 257/678–733, 737, 738, 772–796, E23.001–E23.194, 257/E21.508; 438/122, FOR. 413, 613–617
See application file for complete search history.

(56) References Cited

U.S. PATENT DOCUMENTS

| | | | | |
|---|---|---|---|---|
| 5,097,318 A | * | 3/1992 | Tanaka et al. | 257/690 |
| 5,583,378 A | * | 12/1996 | Marrs et al. | 257/710 |
| 5,593,926 A | * | 1/1997 | Fujihira | 438/114 |
| 5,777,386 A | * | 7/1998 | Higashi et al. | 257/737 |
| 5,814,883 A | * | 9/1998 | Sawai et al. | 257/712 |
| 5,901,041 A | * | 5/1999 | Davies et al. | 361/704 |
| 6,023,098 A | * | 2/2000 | Higashiguchi et al. | 257/712 |
| 6,097,089 A | * | 8/2000 | Gaku et al. | 257/712 |
| 6,472,732 B1 | * | 10/2002 | Terui | 257/678 |

OTHER PUBLICATIONS

Marc Papageorge, et al. "ASAT's Tape Ball Grid Array—The Package with Performance", 5 pgs., 1997, ASAT Ltd., Hong Kong.
Signetics STBGA, Signetics Tape Ball Grid Array Package Type IV Date Sheet (with ground via and 2 metal layer in flex substrate), 2 pgs., Copyright 2004, Signetics, Korea.
L2BGA/EBGA Laser Laminated Ball Grid Array/Enhanced Ball Grid Array Data Sheet, 2 pgs., Silicon Precision Industries Co, Ltd. (SPIL) 2002.
Sanjay Dandia "Asic Packaging", 99 pgs., May 22, 2000, CICC, Philips Semiconductors ATO Innovation.

* cited by examiner

*Primary Examiner*—Jasmine J Clark
(74) *Attorney, Agent, or Firm*—Okamoto & Benedicto LLP

(57) ABSTRACT

In one embodiment, a device is packaged using a low-cost thermally enhanced ball grid array (LCTE-BGA) package. The device may include a die with its backside mounted to the bottom side of a multi-layer packaging substrate. Thermal vias may be formed through the substrate to allow heat to be conducted away from the backside of the die to a top most metal layer of the substrate. Thermal balls may be attached to the bottom side of the substrate on the same plane as the die.

14 Claims, 7 Drawing Sheets

Thermal Via Cu cross-sectional area:
$A_{Cu} = p(0.1mm)^2 - p(0.05mm)^2 = 0.024mm^2$ Via Step Area:
$A_{VS} = (0.4mm)^2 = 0.16mm^2$ Ratio of Cu Area = $A_{Cu}/A_{VS}$ = 0.024/0.16 = 15%

Cu Thermal Conductivity: 360 W/m°C

Via Array Thermal Conductivity:
360(15%) = 53 W/m°C

BT Resin Thermal Conductivity: 0.36 W/m°C

LOW COST THERMALLY ENHANCED SEMICONDUCTOR PACKAGE

CROSS-REFERENCE TO RELATED APPLICATION

This application claims the benefit of U.S. Provisional Application No. 60/618,482, filed Oct. 12, 2004, which is incorporated herein by reference in its entirety.

BACKGROUND OF THE INVENTION

1. Field of the Invention

The present invention relates generally to integrated circuits, and more particularly but not exclusively to integrated circuit packaging.

2. Description of the Background Art

Semiconductor integrated circuits dissipate power during operation, referred to by the term "Pd." In the past, the majority of integrated circuits had Pd's of less than 2 Watts. Some types of integrated circuits (e.g. microprocessors) had Pd's greater than 2 Watts. These integrated circuits require packaging capable of efficiently dissipating power in order to keep the junction temperature of the integrated circuit within acceptable limits. Such packaging is referred to as "thermally enhanced." There are many techniques to thermally enhance a package. A common theme of these conventional techniques is to provide high thermally conductive paths from the silicon die to the outside of the package where the power is dissipated into the printed circuit board (PCB) on which the integrated circuit is mounted and/or into the air above the top surface of the integrated circuit. Each conventional thermal enhancement tends to add additional cost to the package. In general, greater performance results in higher cost. Generally speaking, the Pd of integrated circuits has increased with advancements in integrated circuit technology (in terms of the number of features and feature size) to the point that many integrated circuits now require some form of thermal enhancement. However, many of these integrated circuits cannot afford the additional costs associated with thermal enhancement. Thus, there is a need for a thermally enhanced package having a cost close to that of existing standard (non-thermally enhanced) packages, while offering significant thermal performance.

FIG. 1 schematically shows an example Plastic Ball Grid Array (PBGA) package 100 with thermal balls 102. In the PBGA package 100, the die 101 is mounted on the topside of the substrate 105 and covered by a molded cap 104. The substrate 105 is designed with a section of ground plane directly under the die 101 to which it is bonded. This ground plane connects to a similar ground plane on the bottom side of the substrate 105 using an array of thermal vias 103. An array of thermal solder balls 102 is attached to this bottom side ground plane. The thermal vias 103 provide a high thermal conductivity path from the backside of the die 101 through the substrate 105 to the thermal solder balls 102, which then dissipate heat to the PCB on which the PBGA package 100 is mounted. The PBGA package 100 provides enhanced thermal performance when compared to a PBGA package without thermal vias.

FIG. 2 schematically shows an example Heat Sink Ball Grid Array (HSBGA) package 200 with thermal balls 102 coupled to thermal vias 103. The HSBGA package 200 is very similar to the PBGA package 100 except for a metal heat sink 202 embedded in the mold cap 104 above the die 101. The heat sink 202 has tabs that extend down to the topside surface of the substrate 105 where they contact metal traces. These traces are generally connected to a metal area located under the die 101. This allows the traces to conduct heat away from the die 101 to the heat sink tabs, which then conduct the heat to the exposed metal on the topside of the package. This second path for heat conduction to the topside of the package improves thermal performance.

FIG. 3 schematically shows an example L2-Ball Grid Array (L2-BGA) package 300. The L2-BGA package 300 is quite different from the previously discussed packages 100 and 200. In the L2-BGA package 300, the die 301 is mounted upside down in a cavity on the bottom side of the package 300. This is commonly referred to as a "cavity down" package. The die 301 is bonded within the cavity to a flat metal heat spreader 302. The substrate has a cut-out area to accommodate the die 301, which is fitted to the bottom of the heat spreader 302. Mold compound is used to cover the die 301. In the L2-BGA package 300, there is a very direct path for heat to flow from the back-side of the die 301 to the heat spreader 302 and the topside of the package. The L2-BGA package 300 has the best thermal performance compared to packages 100, 200, and 500 (see FIG. 5).

The L2-BGA package 300 operates in the following manner. There are three methods of heat transfer: conduction, convection and radiation. Of the three, conduction is the most effective. At first glance, it appears that the L2-BGA package 300 with its topside heat spreader 302 is designed to enhance thermal performance by providing convective and radiative cooling from the top surface. However, the L2-BGA package 300 still transfers up to 90% of its heat by conduction through its solder balls 303 to the PCB on which the package is mounted. Thus, the heat spreader 302 actually serves to spread heat from the hot central area of the package (around the die) to the whole surface of the package, thereby allowing more heat to travel through the solder balls 303 at the edges of the package to the PCB.

A second feature of the L2-BGA package 300 is that the topside metal heat spreader 302 provides an excellent place to mount an external heat sink 402 as shown in FIG. 4. The heat sink 402 together with forced airflow greatly increases heat transfer through convection. It is common for very high power integrated circuits (e.g. those with Pd greater than 6 Watts) to be packaged in an L2-BGA package, but require that the customer attaches an external heat sink. The factory does not ship the integrated circuits with heat sinks attached because customers generally want to optimize the heat sink for their particular application.

To summarize, the two essential features of the L2-BGA package 300 are the ability to spread heat across the whole surface of the package and the capability to attach an external heat sink to the top of the package.

FIG. 5 schematically shows an example CSBGA package 500. The CSBGA package 500 is a low cost reduced thermally enhanced ball grid array (BGA) package. In the CSBGA package 500, the die 301 is mounted within a cavity of the substrate 502. The CSBGA package 500 is very similar to the L2-BGA 300 except that the CSBGA package 500 uses a standard 4-layer substrate 502 and it dispenses with the stiffener ring. Both of these features reduce the cost of the starting material compared to an L2-BGA package without greatly impacting thermal performance.

Examples of PBGA, HSBGA, L2-BGA, and CSBGA packages are also available from ASE Inc. (Internet URL: <http://asegloabal.com>).

The above mentioned packages have several disadvantages. Generally speaking, the PBGA and HSBGA packages only work well for integrated circuits that dissipate less than about 3 Watts of power. The L2-BGA package is typically used with integrated circuits with power dissipation greater than 3 Watts. However, the L2 BGA package has two major disadvantages.

The first disadvantage of an L2-BGA package has to do with its starting material, which comprises a combined substrate and heat sink. The substrate usually comprises 3-layers and utilizes laser drilled blind vias. This is a more expensive technology compared to a standard 4-layer substrate with thru-hole vias. In addition, an extra manufacturing step is required to create the center cavity to accommodate the die. The heat sink is actually manufactured from two separate pieces of nickel-plated copper sheet. The top piece is the main heat spreader. The bottom piece has a hole punched out to accommodate the die and acts as a stiffener ring. Both pieces are bonded together with a layer of fiberglass and epoxy resin. This complex assembly is needed to control warping of the package caused by the mismatch of thermal coefficients of expansion of the various different materials used. This heat sink assembly is then bonded to the substrate. This multi-layer assembly is substantially more expensive when compared to a simple 4-layer substrate such as that used in a PBGA package.

The second disadvantage of an L2-BGA package relates to its manufacturability. The L2 BGA package is assembled as individual pieces. This makes it less efficient to manufacture compared to packages that can be assembled in strip form. The L2-BGA package is offered in a number of standard body sizes, for example 27×27 mm, 31×31 mm, and 35×35 mm. For each different body size, a different set of manufacturing tooling is required to handle the package during manufacture. Additionally, because each package is a single piece, each one must be handled separately. In comparison, other packages (e.g. PBGA) are manufactured in a strip of multiple packages. The strips have a common form factor, allowing the use of a single set of manufacturing tools to manufacture many different sizes and configurations of the basic package type. Furthermore, as each strip contains multiple packages (e.g. eight packages) and the manufacturing process needs to only handle strips, there is far less handling on a per-package basis. These factors result in the manufacturing cost of the L2-BGA package being higher due to additional capital, and also result in variable costs to be higher due to increased handling.

A CSBGA package attempts to reduce the cost of an L2-BGA package in two ways. First, the CSBGA package uses standard 4-layer substrate technology. Second, the CSBGA package uses a simpler heat spreader. However, the CSBGA package still suffers from the manufacturability problems of the L2-BGA package. Furthermore, in practice, the CSBGA package is not significantly cheaper than the L2-BGA.

What is needed is a low cost packaging alternative that is capable of spreading heat and readily allows for the use of an external heat sink.

SUMMARY

In one embodiment, a device is packaged using a low-cost thermally enhanced ball grid array (LCTE-BGA) package. The device may include a die with its backside mounted to the bottom side of a multi-layer packaging substrate. Thermal vias may be formed through the substrate to allow heat to be conducted away from the backside of the die to a top most metal layer of the substrate. Thermal balls may be attached to the bottom side of the substrate on the same plane as the die.

These and other features of the present invention will be readily apparent to persons of ordinary skill in the art upon reading the entirety of this disclosure, which includes the accompanying drawings and claims.

DETAILED DESCRIPTION

In the present disclosure, numerous specific details are provided, such as examples of structures, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
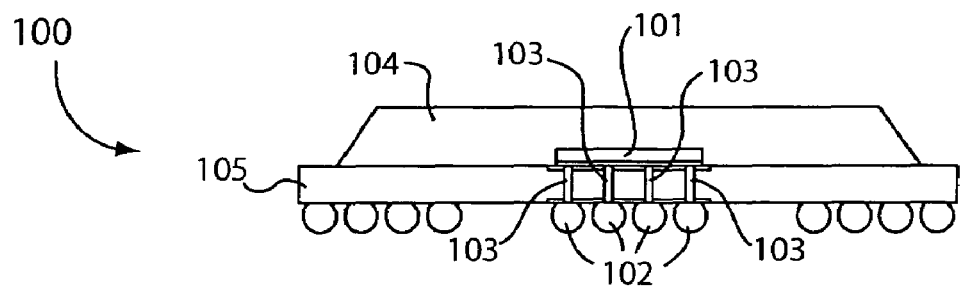
FIG. 1 schematically shows an example Plastic Ball Grid Array (PBGA) package with thermal balls.
Figure 2:
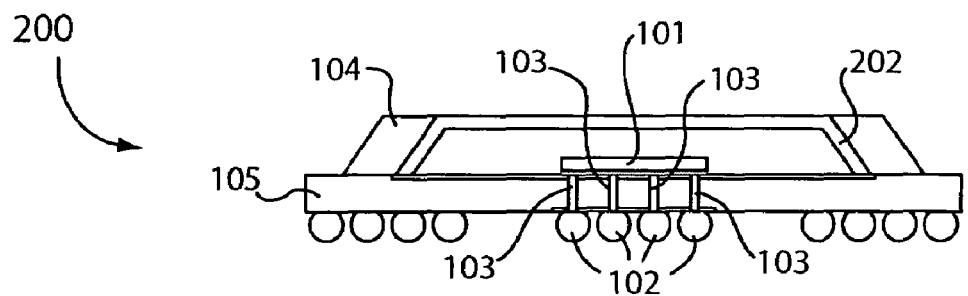
FIG. 2 schematically shows an example Heat Sink Ball Grid Array (HSBGA) package with thermal balls coupled to thermal vias.
Figure 3:
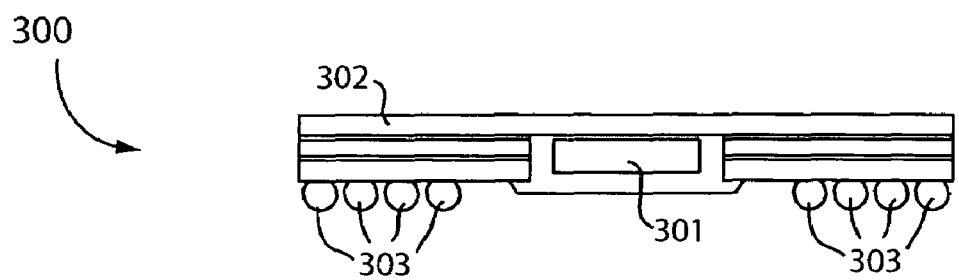
FIG. 3 schematically shows an example L2-Ball Grid Array (L2-BGA) package.
Figure 4:
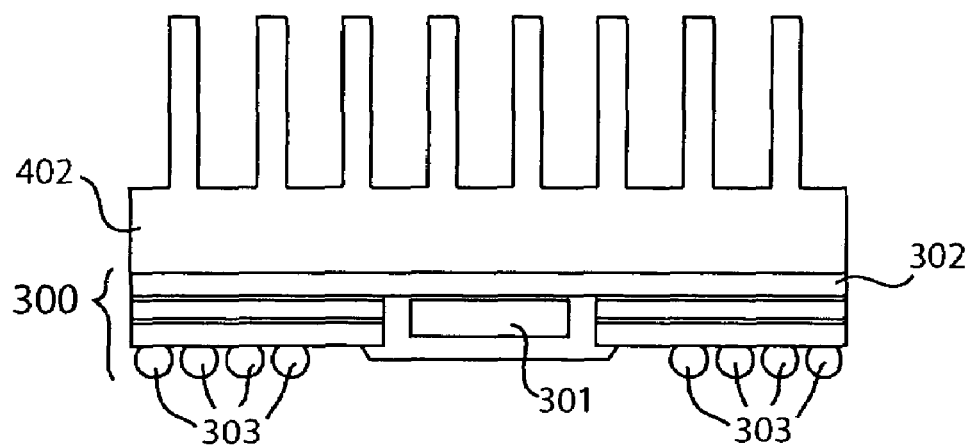
FIG. 4 schematically shows the L2-BGA package of FIG. 3 with an external heat sink.
Figure 5:
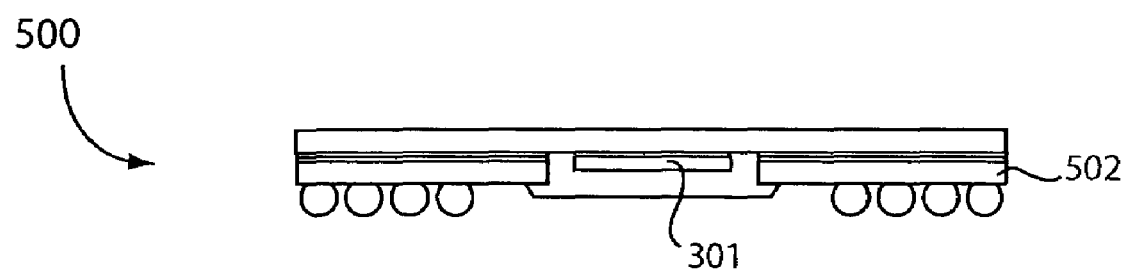
FIG. 5 schematically shows an example CSBGA package.
Figure 6:
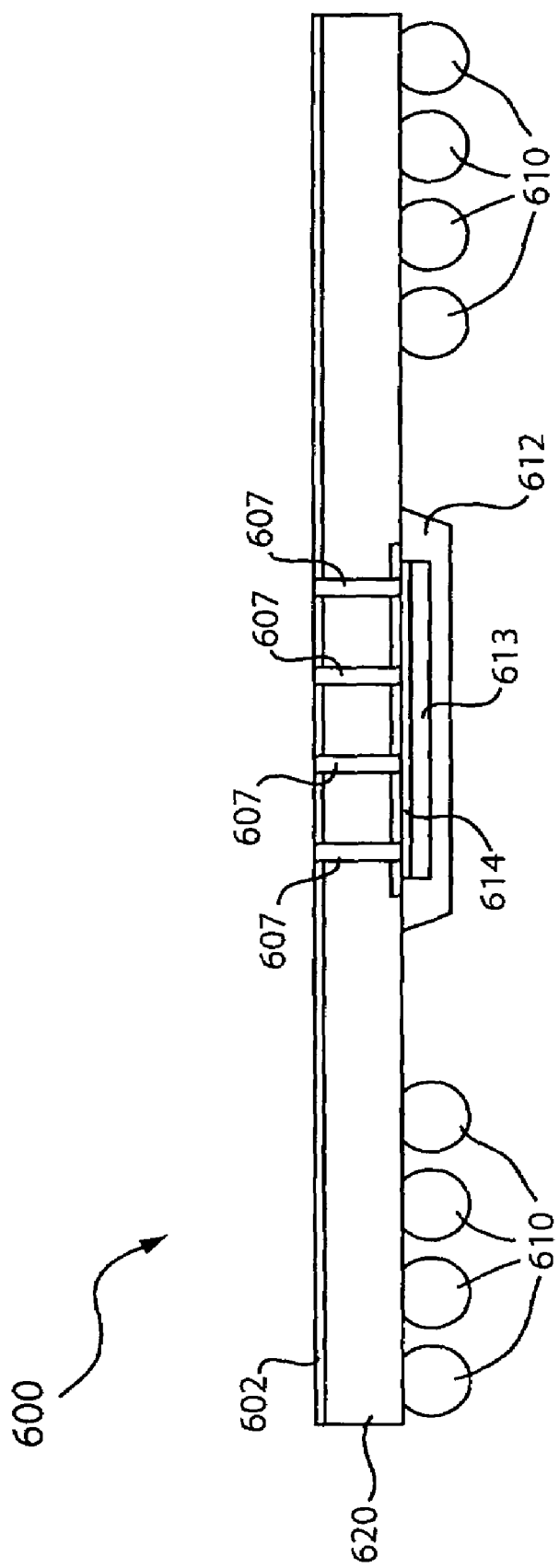
FIG. 6 schematically shows a low cost thermally enhanced ball grid array (LCTE-BGA) package in accordance with an embodiment of the present invention.

Referring now to FIG. 6, there is schematically shown a low cost thermally enhanced ball grid array (LCTE-BGA) package 600 in accordance with an embodiment of the present invention. In the LCTE-BGA package 600, the backside of a die 613 is mounted to the bottom side of a packaging substrate 620 using a thermally conductive adhesive 614. The front side (i.e. active side) of the die 613 faces the PCB. In one embodiment, the die 613 is a semiconductor die containing an integrated circuit. A mold cap 612 protectively covers the die 613. Solder balls 610 allow the LCTE-BGA package 600 to be soldered onto a PCB. Unlike those of the packages 300 and 500, the substrate 620 does not have a recess or cavity for accommodating a die. In the example of FIG. 6, the bottom side of the substrate 620 (i.e. the side facing the PCB) is substantially uniform and planar. The die 613 and the solder balls 610 are mounted on the same plane on the bottom side of the substrate 620.

Thermal vias 607 formed through the substrate 620 conduct heat away from the backside of the die 613. Mounting the die 613 with its backside towards the bottom side of the substrate 620 allows a top metal layer 602 in the substrate 620 to serve as a heat spreader. This advantageously allows for the use of a relatively simple 2-layer or 4-layer substrate 620 without any additional mechanical processing, such as routing out a recess or cavity for the die 613. The LCTE-BGA package 600 consequently has very low starting material cost and enjoys the manufacturing advantages of a PBGA package while still providing much of the thermal performance of an L2-BGA package.

Figure 7:
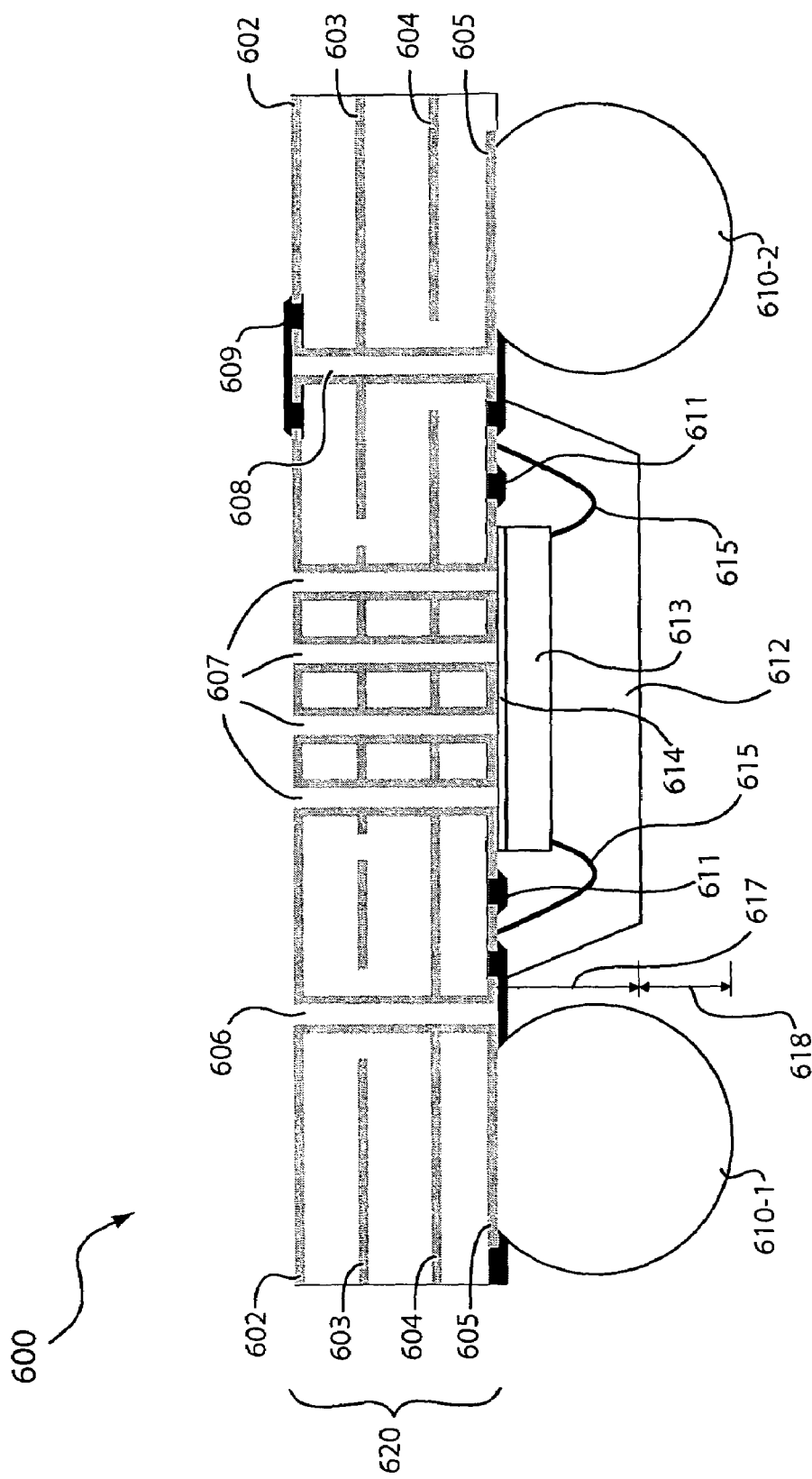
FIG. 7 schematically shows a more detailed cross-sectional view of the center part of the LCTE-BGA package of FIG. 6.

FIG. 7 schematically shows a more detailed cross-sectional view of the center part of the LCTE-BGA package 600. In the example of FIG. 7, the substrate 620 comprises a laminate substrate composed of 4 layers of metal (e.g. copper) interconnect that are bonded together with BT resin and other strengthening materials (e.g. glass fiber). The 4-layers of metal interconnect includes a topside metal layer 602, an inner metal layer 603, an inner metal layer 604, and a bottom side metal layer 605. The topside metal layer 602, a ground plane in the example of FIG. 7, is the topmost metal layer in the substrate 620 and may comprise a plane of copper electrically connected to ground. The inner metal layer 603, a power plane in the example of FIG. 7, may comprise a plane of copper electrically connected to the power supply. The inner metal layer 604, a ground plane in the example of FIG. 7, may comprise a plane of copper electrically connected to ground. The bottom side metal layer 605 is the lowest (i.e. metal layer closest to the PCB) metal layer and may comprise a plurality of copper conductors used to route electrical signals between various electrical nodes within the substrate 620. Note that metal layers 602, 603, 604, and 605 may also serve other purposes depending on implementation.

Electrical connections in the vertical direction between the various metal layers are provided by electrical vias, such as vias 606 and 608. The via 606 is an example electrical connection between a solder ball 610-1 and ground planes in the substrate 620. In the example of FIG. 7, the solder ball 610-1 is connected to metal layers 602 and 604, which are ground planes, by way of metal layer 605. As the ground planes are also the primary thermal conduction paths, vias connected to these planes also serve an important thermal function. The via 608 is an example electrical connection between a solder ball 610-2 and a power plane. In the example of FIG. 7, the solder ball 610-2 is connected to the metal layer 603, which serves as a power plane, by way of the metal layer 605.

In the example of FIG. 7, thermal vias 607 serve a pure thermal function by conducting heat from the backside of the die 613 to ground planes (i.e. metal layers 602 and 604) within the substrate 620. A thermal via 607 may comprise a cylindrical hollow copper tube.

In the example of FIG. 7, the die 613 is bonded to an area of copper on the bottom side metal layer 605 using the adhesive 614, which may comprise thermally conductive glue (e.g. silver epoxy). Electrical connections between the front side of the die 613 and the bottom side metal layer 605 are provided by wire-bonds 615. Solder mask material may be used to mask off areas of the topside metal layer 602 (e.g. see mask 609) and bottom side metal layer 605 (e.g. see masks 611). The masks 611 on the bottom side metal layer 605 advantageously prevent solder from adhering to undesired areas during the solder ball attach process. The mask 609 on the topside metal layer electrically insulates areas of conductor that are not connected to electrical ground; this facilitates connection of an electrically conducting external heat sink to the topside of the package 600 without causing an electrical short circuit. The mold cap 612, which may comprise a cap of mold compound or other insulating material, protects the die 613 and its associated wire bonds 615 from damage.

As can be appreciated, the LCTE-BGA package 600 uses materials and manufacturing methods commonly employed in the semiconductor packaging industry in a novel configuration that allows the package 600 to be readily produced at relatively low cost compared to conventional packages.

Conventional packages require a cavity in which to locate the semiconductor die. The LCTE-BGA package 600 does not require such cavity or recess and instead mounts the die 613 with its backside on the bottom surface (metal layer 605 in the example of FIG. 7) of the substrate 620 substantially on the same plane as the solder balls 610 (i.e. 610-1, 610-2, etc.). In one embodiment, a backgrind process removes material from the backside of a wafer containing a die 613 to reduce the wafer's thickness prior to packaging and to provide a clean, roughened surface that will adhere well to the die attach material. An un-background wafer has a thickness of about 600 μm (30 mils); the backgrind process typically reduces this wafer thickness to between about 350 μm to 275 μm (14~11 mils). Current processes in use in the industry are capable of backgrinding to a thickness of just 125 μm (5 mils). These thin wafers are used in the manufacture of stacked die packages where multiple dies are stacked on top of each other within a single package.

Still referring to FIG. 7, a dimension 617 is the total height of the mold cap 612 and a dimension 618 is the remaining clearance between the mold cap 612 and the bottom of the solder balls 610. In the example of FIG. 7, the total height of dimension 617 plus dimension 618 needs to be less than the height of a solder ball 610, which is typically about 650 μm after ball attach for a nominal solder ball size of 750 μm. An L2-BGA package specification for dimension 618, the clearance between the surface of a mold cap and the bottom of a solder ball, is 200 μm. Thus, the total available height for the mold cap is 450 μm for an L2-BGA package. Assuming a typical die attach thickness of 25 μm, a semiconductor die thickness of 125 μm, a typical wire-bond loop height of 125 μm and a typical mold cap thickness above the maximum wire-bond loop of 125 μm, the mold cap height can be calculated to be 400 μm (i.e. 25+125+125+125), leaving an additional 50 μm available for manufacturing tolerances. Therefore, utilizing 125 μm thick wafers allows the mold cap 612 of the LCTE-BGA package 600 to be formed within all existing specifications of an L2-BGA package without the need for a special cavity.

Figure 8:
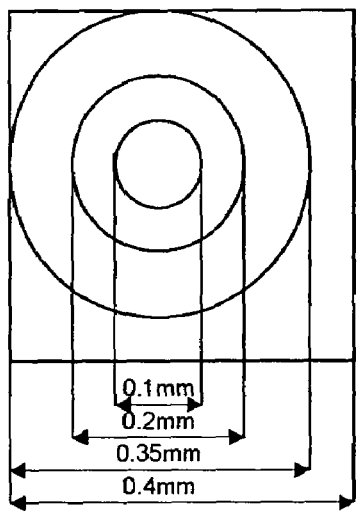
FIG. 8 shows an example simple thermal conductivity analysis of a standard thermal via.

The effectiveness of the LCTE-BGA package 600 is related to how well the thermal vias 607 conduct heat from the die 613 to the topside of the package. FIG. 8 shows an example simple thermal conductivity analysis of a standard thermal via. FIG. 8 shows that the thermal conductivity of a thermal via is 53 W/m° C. compared to 360 W/m° C. for a copper plane and 0.36 W/m° C. for bismaleimide triazine (BT) resin, which is standard substrate material. Using the calculations shown in FIG. 8 and a basic one-dimensional analysis, the $\theta_{JC}$ (Junction to Case thermal resistance) of an LCT-BGA package may be determined and compared to that of an L2-BGA package as follows.

The formula for thermal resistance is $$R = \frac{L}{kA},$$

where:
L is the length of the thermal path,
k is the thermal conductivity, and
A is the cross-sectional area of the thermal path.

Assuming a die size of 100 mm² and a standard 4-layer substrate thickness of 0.54 mm, the $\theta_{JC}$ of an L2-BGA, an LCTE-BGA, and a non-thermally enhanced package with no thermal vias are given below:

L2-BGA: $\theta_{JC}$=0.54 mm/(360 W/m° C.×100 mm²)=0.015° C./W

LCTE-BGA: $\theta_{JC}$=0.54 mm/(53 W/m° C.×100 mm²)=0.10° C./W

And if no thermal vias were used: $\theta_{JC}$=0.54 mm/(0.36 W/m° C.×100 mm²)=15° C./W In all of the packages in the above analysis, the die is attached to the substrate with a 0.025 mm layer of silver epoxy glue whose thermal conductivity is about 1.35 W/m° C., giving the glue a thermal resistance of 0.185° C./W, which is additive to the resistance of the package.

It can be seen from the above analysis that if a device is dissipating 10 W of power, the temperature difference across the substrate (bottom to top) is as shown in Table 1 for the three cases.

TABLE 1

| Package | Thermal Resistance | Temperature Difference |
|---|---|---|
| L2-BGA | (0.015 + 0.185) ° C./W | 2.0° C. |
| LCTE-BGA | (0.1 + 0.185) ° C./W | 2.9° C. |
| No Thermal Vias | (15 + 0.185) ° C./W | 151.9° C. |

Thus, even for a high power dissipation example of 10 W, the temperature differential to the top of the package of the L2-BGA package and the LCTE-BGA package are both comparable and are not significant in practical terms. In the case of the L2-BGA, $\theta_{JC}$ is in fact dominated by the thermal resistance of the die attach material so direct attachment to a copper heat spreader offers very small additional benefit. There is significant benefit to adding thermal vias over a solid BT resin substrate (2.9° C. versus 151.9° C.).

The most immediate benefit of a heat spreader in either an L2-BGA package or LCTE-BGA package is to distribute heat over the full surface area of the package. This allows every solder ball on the underside of the package to more effectively contribute to conducting heat into the PCB. However, in a 4-layer substrate, the internal power and ground planes (and especially the ground plane if connected to thermal vias) also act as very good heat spreaders. Effectively, the power and ground planes are almost free thermal enhancement, given that they are needed for the electrical performance of the package. It is believed that simply adding these planes and thermal vias to a package offers almost as much thermal performance as adding thermal balls.

An L2-BGA package with a relatively expensive copper heat spreader provides significant advantages over a conventional PBGA package that uses internal metal planes for dissipating heat. The heat spreader is thicker than conventional internal metal planes for better heat conduction and provides a means of dissipating heat to the air via convention and radiation. The heat spreader also allows for more effective heat transfer by conduction to an external heat sink mounted on the top of the package. Considering the thickness advantage, an L2-BGA heat spreader is typically about 500 mm thick versus a substrate copper layer thickness of 35 μm (1 oz) or 70 μm (2 oz). Using the formula for thermal resistance, the resistance edge to edge for two square sheets of copper each 20 mm on a side, one with a thickness of 0.5 mm and one with a thickness of 0.070 mm is as follows:

R1=20 mm/(360 W/m° C.×10 mm²)=5.6° C./W . . . Resistance of 0.5 mm heat spreader R2=20 mm/(360 W/m° C.×1.4 mm²)=39.7° C./W . . . Resistance of 0.07 mm substrate copper layer The analysis immediately above shows that the L2-BGA heat spreader confers a significant thermal advantage (factor of about 7) over a 70 μm substrate copper layers by virtue of its thickness. This is the main thermal advantage of the L2-BGA package over a conventional PBGA package with power and ground planes.

Although it also uses power and ground planes for heat dissipation, an LCTE-BGA package includes features that significantly improve its thermal performance. Unlike a conventional PBGA package, which uses internal metal planes having thicknesses that are fixed when the substrate is manufactured, an LCTE-BGA package exposes one plane fully on the topside of the package (e.g. see metal layer 602 in FIG. 7). The exposed top metal plane makes it possible to easily add additional materials or structures that reduce the thermal resistance of the top metal plane.

Figure 9:
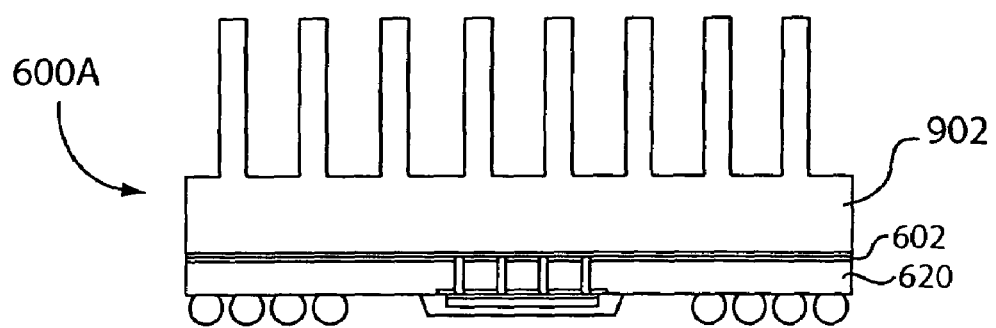
FIGS. 9, 10, and 11 schematically show LCTE-BGA packages in accordance with other embodiments of the present invention.
Figure 10:
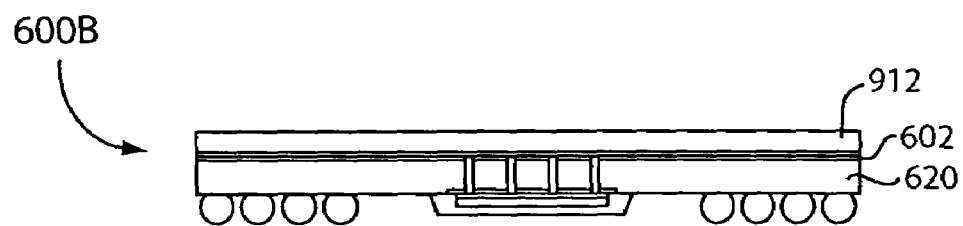
Figure 11:
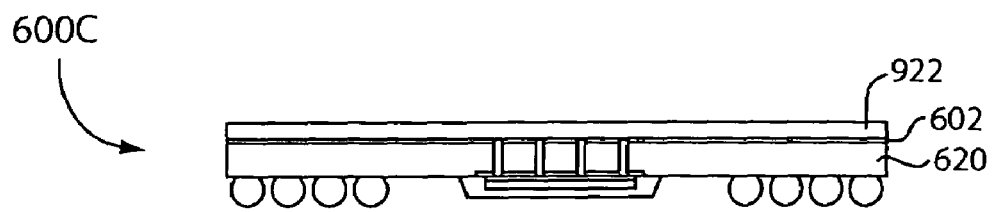

FIGS. 9, 10, and 11 schematically show three embodiments of the LCTE-BGA package 600 with added thermal enhancement.

FIG. 9 schematically shows an LCTE-BGA package 600A in accordance with an embodiment of the present invention. The LCTE-BGA package 600A is the same as the previously discussed LCTE-BGA package 600 except for the addition of a heat sink 902 on the topside of the package 600A. In one embodiment, the metal heat sink 902 is an external piece that is attached to an exposed top most metal layer (e.g. metal layer 602) of the substrate 620. This is a desirable configuration in cases where the thermal performance of the package alone is insufficient for the application. The LCTE-BGA package 600A provides a solution comparable to an L2-BGA package at a much lower cost as the external heat sink 902 completely mitigates the thinner heat spreaders (i.e. metal layers 602-605 shown in FIG. 7) in the substrate 620.

FIG. 10 shows an LCTE-BGA package 600B in accordance with an embodiment of the present invention. The LCTE-BGA package 600B is the same as the previously discussed LCTE-BGA package 600 except for the addition of a metal heat spreader 912 on the topside of the package 600B. In one embodiment, the metal heat spreader 912 is a separate piece that is attached to the exposed top most metal layer (e.g. metal layer 602) of the substrate 620. This solution is almost thermally equivalent to a standalone L2-BGA package. However, given that the heat spreader 912 is a separate piece (i.e. not integral to the package), unlike that of an L2-BGA package, the heat spreader 912 may be applied after manufacture of the package. Furthermore, the heat spreader 912 does not need to mitigate any coefficient of thermal expansion mismatch or warping issues, unlike an L2-BGA package with its multi-layer heat spreader with internal glass fiber bonding and stiffener ring.

FIG. 11 shows an LCTE-BGA package 600C in accordance with an embodiment of the present invention. The LCTE-BGA package 600C is the same as the previously discussed LCTE-BGA package 600 except that a coating 922 comprising a high thermal conductivity material is formed on the topside of the package 600C. In one embodiment, the coating 922 is formed on the exposed top most metal layer (e.g. metal layer 602) of the substrate 620. The coating 922 may comprise any available high conductivity material, such as thermal grease and various metal/glue mixtures, without detracting from the merits of the present invention. A major advantage of using the coating 922 is that it may be applied after assembly of the package 600C; this means that the material of coating 922, whatever it composition, does not need to be compatible with the manufacturing process of the package 600C. Additionally, the coating 922 may be applied on an as needed basis. For example, slow speed integrated circuits may not dissipate sufficient power to require the coating 922, but faster versions of the same device would. The flexibility of the LCTE-BGA package 600C allows customization of the thermal solution to the specific product. This is in marked contrast to an L2-BGA, which forces every part to use the same expensive, starting material.

Another advantage of the LCTE-BGA 600 is the fact that the die 613 is mounted with its front side facing down towards the PCB. Thus, all electrical connections from the die 613 to the solder balls 610 may be routed on the bottom side metal layer 605 of the substrate 620 (see FIG. 7). In the case of a PBGA package, the die is mounted on the topside of the substrate. Every unique electrical signal from the die must be routed through its own via from the topside of the substrate to the solder ball on the bottom side. Each via through the substrate required a clearance hole in all the internal planes of the substrate. Thus, the internal planes of a PBGA substrate are barely contiguous; many cut-outs exist for the array of vias. This impacts the thermal performance of the PBGA package. In contrast, the LCTE-BGA 600 requires no vias for signal traces so its internal planes may be almost solid sheets of copper, allowing for maximum thermal benefits of internal planes.

Figure 12:
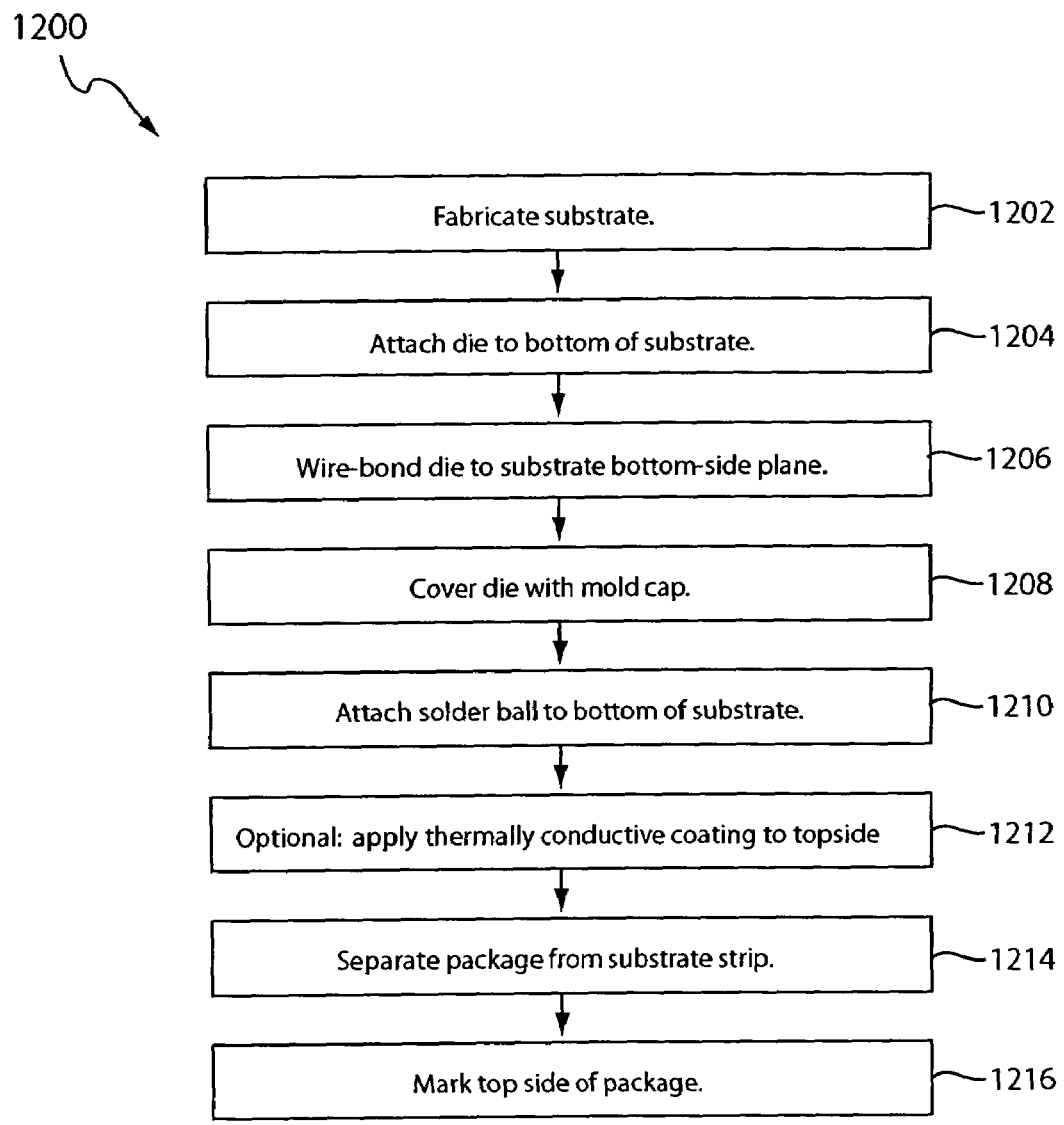
FIG. 12 shows a flow diagram of a method of packaging a device in accordance with an embodiment of the present invention The use of the same reference label in different drawings indicates the same or like components. The drawings are not necessarily to scale unless otherwise noted.

Another advantage of the LCTE-BGA package is that it uses standard manufacturing technology common in the manufacture of PBGA and array molded BGA packages. FIG. 12 shows a flow diagram of a method 1200 for packaging a device in accordance with an embodiment of the present invention. The method 1200 is optimized for the manufacture of LCTE-BGA packages but may also be adapted for other, similar packages.

In step 1202, the substrate is fabricated. The substrate design and fabrication method may be similar to those of standard substrates. However, the unique features of the LCTE-BGA package with the die flag (area on substrate to which the die is attached) on the bottom side of the substrate with an array of thermal vias to a contiguous topside plane are incorporated into the design. Multiple package substrates may be incorporated into a single standard size substrate strip.

In step 1204, the backside of the die is attached to the bottom surface of the substrate. In one embodiment, the die is attached to a bottom side metal layer of the substrate. Although die attach is to the bottom side of the substrate, it is otherwise a standard process.

In step 1206, wire-bonding is performed to electrically connect nodes on the front side of the die to the bottom side metal layer of the substrate. In one embodiment, all electrical connections from the front side of the die only go the bottom side metal layer. Wire-bonding is performed using a standard process.

In step 1208, a mold cap is formed over the die. Molding of individual mold caps over each die in the substrate strip may be performed using a standard process similar to how leaded packages are molded with small separate mold cavities for each device on the substrate strip.

In step 1210, solder balls are attached to the bottom side of the substrate. In one embodiment, the solder balls are attached to the bottom side metal layer of the substrate. Solder ball attach may be performed slightly different from standard processes. Typically, a mask is used to position solder balls over each land pad on the bottom side of the substrate strip. In the case of the LCTE-BGA package, the mask also contains a cut-out region to accommodate the mold cap present on the same side of the package as the solder balls.

In optional step 1212, thermally conductive coating may be applied to the topside of the substrate.

In step 1214, the package is separated from the substrate strip. Singluation of the individual packages from the substrate strip may be performed using the standard process of either sawing or punch-out.

In step 1216, the topside of the package is marked. Marking of the topside of the package may be performed using standard processes of laser marking or ink marking.

An LCTE-BGA package may also be fabricated using other manufacturing methods including standard BGA manufacturing methods with only minor alterations as many of the methods used in the manufacture of BGA packages are applicable to the manufacture of an LCTE-BGA package.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A device comprising:
   a multi-layer packaging substrate;
   a die with an integrated circuit, a backside of the die being attached to a bottom side of the substrate;
   a plurality of solder balls attached to the bottom side of the substrate;
   a plurality of thermal vias formed through the substrate, the thermal vias being configured to conduct heat away from the backside of the die to a first metal layer of the substrate, the first metal layer being a top most metal layer of the substrate;
   wire bonds electrically coupling electrical nodes on a front side of the die to a second metal layer;
   wherein the backside of the die is attached to the second metal layer of the substrate, the second metal layer being a bottom metal layer of the substrate.

2. The device of claim 1 wherein the backside of the die is attached to the second metal layer using a thermally conductive glue.

3. The device of claim 1 wherein the first metal layer and the second metal layer comprise copper.

4. A device comprising:
   a packaging substrate having a plurality of metal layers;
   a die with an integrated circuit, the die having a backside attached to a bottom metal layer in the plurality of metal layers;
   a plurality of solder balls attached to the bottom metal layer and on a same plane as the die;
   a plurality of thermal vias formed through the substrate, the thermal vias being configured to thermally couple the backside of the die to a top metal layer in the plurality of metal layers; and
   a protective cover over the die.

5. The device of claim 4 wherein the top metal layer comprises an exposed surface of the substrate.

6. The device of claim 4 wherein the top metal layer comprises a copper ground plane.

7. The device of claim 4 further comprising a heat sink attached to the top metal layer.

8. The device of claim 4 further comprising a thermally conductive coating applied to the top metal layer.

9. A device comprising:
   a multi-layer packaging substrate;
   a die with an integrated circuit, a backside of the die being attached to a bottom side of the substrate;
   a plurality of solder balls attached to the bottom side of the substrate;
   a plurality of thermal vias formed through the substrate, the thermal vias being configured to conduct heat away from the backside of the die to a first metal layer of the substrate, the first metal layer being a top most metal layer of the substrate; and a thermally conductive material coupled to the first metal layer;

wherein the die is substantially on a same plane as the solder balls.

10. A device comprising:

a multi-layer packaging substrate;

a die with an integrated circuit, a backside of the die being attached to a bottom side of the substrate;

a plurality of solder balls attached to the bottom side of the substrate;

a plurality of thermal vias formed through the substrate, the thermal vias being configured to conduct heat away from the backside of the die to a first metal layer of the substrate, the first metal layer being a top most metal layer of the substrate;

an external heat sink attached to the first metal layer;

wherein the die is substantially on a same plane as the solder balls.

11. A device comprising:

a multi-layer packaging substrate;

a die with an integrated circuit, a backside of the die being attached to a bottom side of the substrate;

a plurality of solder balls attached to the bottom side of the substrate;

a plurality of thermal vias formed through the substrate, the thermal vias being configured to conduct heat away from the backside of the die to a first metal layer of the substrate, the first metal layer being a top most metal layer of the substrate;

wherein the backside of the die is attached to a second metal layer of the substrate, the second metal layer being a bottom metal layer of the substrate;

wherein the die is substantially on a same plane as the solder balls.

12. A device comprising:

a multi-layer packaging substrate;

a die with an integrated circuit, a backside of the die being attached to a bottom side of the substrate;

a plurality of solder balls attached to the bottom side of the substrate;

a plurality of thermal vias formed through the substrate, the thermal vias being configured to conduct heat away from the backside of the die to a first metal layer of the substrate, the first metal layer being a top most metal layer of the substrate;

a protective mold cap formed over the die;

wherein the backside of the die is attached to a second metal layer of the substrate, the second metal layer being a bottom metal layer of the substrate.

13. A device comprising:

a multi-layer packaging substrate;

a die with an integrated circuit, a backside of the die being attached to a bottom side of the substrate;

a plurality of solder balls attached to the bottom side of the substrate;

a plurality of thermal vias formed through the substrate, the thermal vias being configured to conduct heat away from the backside of the die to a first metal layer of the substrate, the first metal layer being a top most metal layer of the substrate;

a thermally conductive material coupled to the first metal layer; and a protective mold cap formed over the die.

14. A device comprising:

a multi-layer packaging substrate;

a die with an integrated circuit, a backside of the die being attached to a bottom side of the substrate;

a plurality of solder balls attached to the bottom side of the substrate;

a plurality of thermal vias formed through the substrate, the thermal vias being configured to conduct heat away from the backside of the die to a first metal layer of the substrate, the first metal layer being a top most metal layer of the substrate;

an external heat sink attached to the first metal layer; and a protective mold cap formed over the die.

* * * * *